United States Patent
Kyoh

(10) Patent No.: US 7,539,962 B2
(45) Date of Patent: May 26, 2009

(54) PATTERN DATA CORRECTING METHOD, PHOTO MASK MANUFACTURING METHOD, SEMICONDUCTOR DEVICE MANUFACTURING METHOD, PROGRAM AND SEMICONDUCTOR DEVICE

(75) Inventor: Suigen Kyoh, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 680 days.

(21) Appl. No.: 11/219,813

(22) Filed: Sep. 7, 2005

(65) Prior Publication Data

US 2006/0053402 A1    Mar. 9, 2006

(30) Foreign Application Priority Data

Sep. 8, 2004    (JP) .............................. 2004-261344

(51) Int. Cl.
*G06F 17/50* (2006.01)
*H01L 23/00* (2006.01)

(52) U.S. Cl. .............................. 716/8; 716/19; 257/500

(58) Field of Classification Search .................... 716/8, 716/19; 257/500
See application file for complete search history.

(56) References Cited

U.S. PATENT DOCUMENTS

| | | | | |
|---|---|---|---|---|
| 5,767,555 A | * | 6/1998 | Sakano et al. ............... | 257/401 |
| 5,977,606 A | * | 11/1999 | Sakurai et al. ............... | 257/507 |
| 6,218,217 B1 | * | 4/2001 | Uenishi et al. ............... | 438/138 |
| 6,642,120 B2 | * | 11/2003 | Terashima .................... | 438/309 |
| 2002/0185681 A1 | * | 12/2002 | Nakano et al. ............... | 257/336 |
| 2003/0081305 A1 | * | 5/2003 | Chung et al. ................. | 359/296 |
| 2003/0111694 A1 | * | 6/2003 | Terashima .................... | 257/370 |
| 2004/0232475 A1 | * | 11/2004 | Kataoka et al. .............. | 257/315 |
| 2006/0097311 A1 | * | 5/2006 | Ishii et al. .................... | 257/322 |

FOREIGN PATENT DOCUMENTS

| | | | |
|---|---|---|---|
| JP | 05041523 A | * | 2/1993 |
| JP | 10242296 A | * | 9/1998 |
| JP | 2002-131882 | | 5/2002 |
| JP | 2004-317718 | | 11/2004 |

* cited by examiner

*Primary Examiner*—Phallaka Kik
(74) *Attorney, Agent, or Firm*—Finnegan, Henderson, Farabow, Garrett & Dunner, L.L.P.

(57) ABSTRACT

There is provided a method of correcting pattern data for a semiconductor device, including acquiring pattern data for a lower layer, pattern data for an upper layer, and pattern data for a connecting layer containing connecting patterns to connect patterns contained in the lower layer and patterns contained in the upper layer, grouping patterns contained in the lower layer, the upper layer, and the connecting layer into a plurality of groups in which patterns in the same group are to be set at the same electric potential, acquiring a first distance between one edge of one connecting pattern contained in one group and an edge of a pattern contained in another group, and moving the one edge in a direction in which a size of the one connecting pattern increases, based on the first distance.

16 Claims, 9 Drawing Sheets

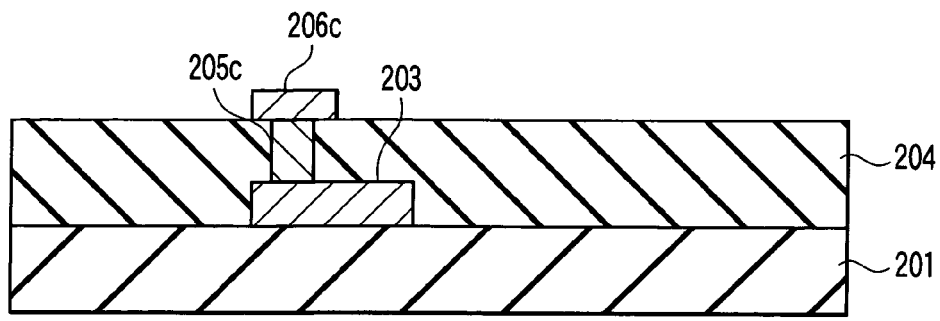
F I G. 1 2 A
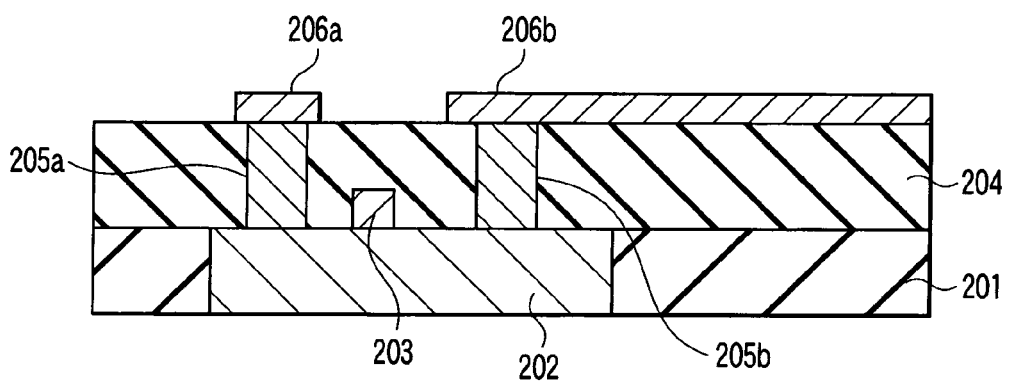
F I G. 1 2 B
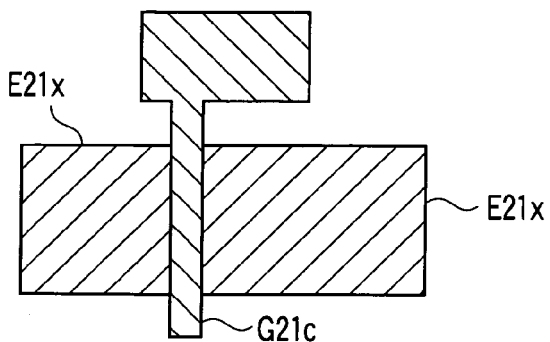
F I G. 1 3 A
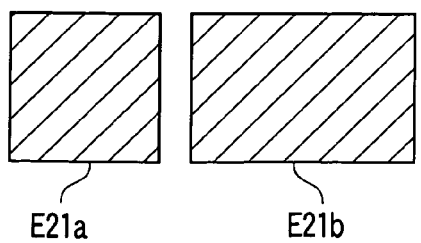
F I G. 1 3 B

PATTERN DATA CORRECTING METHOD, PHOTO MASK MANUFACTURING METHOD, SEMICONDUCTOR DEVICE MANUFACTURING METHOD, PROGRAM AND SEMICONDUCTOR DEVICE

CROSS-REFERENCE TO RELATED APPLICATIONS

This application is based upon and claims the benefit of priority from prior Japanese Patent Application No. 2004-261344, filed Sep. 8, 2004, the entire contents of which are incorporated herein by reference.

BACKGROUND OF THE INVENTION

1. Field of the Invention

The present invention relates to a method of correcting pattern data or the like.

2. Description of the Related Art

With a downsized and highly dense semiconductor device, it has been difficult to reliably form a contact hole. Thus, there occurs a problem that an upper layer pattern and a lower layer pattern cannot be reliably connected to each other by means of the contact hole, which is a main cause of the lowered yield of the semiconductor device. A size of the contact hole may be increased in order to reliably form the contact hole. However, if the size of the contact hole is merely increased, a distance between the contact hole and an adjacent pattern becomes too short. Thus, the contact hole pattern and the adjacent pattern come into contact with each other, an electrical short-circuit is likely to occur, making a main cause of the lowered yield of the semiconductor device. Therefore, conventionally, it has been difficult to enable the increased size of the contact hole, and moreover, to maintain the distance between the contact hole and the adjacent pattern to be constant or more.

In Jpn. Pat. Appln. KOKAI Publication No. 2002-131882, there has been made a proposal that a size of a contact hole pattern is corrected in order to enhance a process latitude. However, this proposal focuses on only contact hole patterns in the same layer, and it is difficult to avoid the above described problem.

As described above, conventionally, it has been difficult to increase a size of a connecting pattern such as a contact hole, making a main cause of the lowered yield of the semiconductor device.

BRIEF SUMMARY OF THE INVENTION

According to a first aspect of the present invention, there is provided a method of correcting pattern data for a semiconductor device, comprising: acquiring pattern data for a lower layer, pattern data for an upper layer, and pattern data for a connecting layer containing connecting patterns to connect patterns contained in the lower layer and patterns contained in the upper layer; grouping patterns contained in the lower layer, the upper layer, and the connecting layer into a plurality of groups in which patterns in the same group are to be set at the same electric potential; acquiring a first distance between one edge of one connecting pattern contained in one group and an edge of a pattern contained in another group; and moving the one edge in a direction in which a size of the one connecting pattern increases, based on the first distance.

According to a second aspect of the present invention, there is provided a computer program product configured to store program instructions for execution on a computer and used for correcting pattern data for a semiconductor device, the program instructions causing the computer to perform: acquiring pattern data for a lower layer, pattern data for an upper layer, and pattern data for a connecting layer containing connecting patterns to connect patterns contained in the lower layer and patterns contained in the upper layer; grouping patterns contained in the lower layer, the upper layer, and the connecting layer into a plurality of groups in which patterns in the same group are to be set at the same electric potential; acquiring a first distance between one edge of one connecting pattern contained in one group and an edge of a pattern contained in another group; and moving the one edge in a direction in which a size of the one connecting pattern increases, based on the first distance.

According to a third aspect of the present invention, there is provided a semiconductor device having a plurality of groups in which patterns in the same group are to be set at the same electric potential, each of the groups comprising: a lower layer pattern contained in a lower layer; an upper layer pattern contained in an upper layer; a connecting pattern contained in a connecting layer between the lower layer and the upper layer, and adopted to connect the lower layer pattern and the upper layer pattern to each other, wherein a position of one edge of one connecting pattern contained in one group is determined depending on a first distance between the one edge and an edge of a pattern contained in another group.

BRIEF DESCRIPTION OF THE SEVERAL VIEWS OF THE DRAWING

FIGS. 12A and 12B are views each showing a sectional structure of a semiconductor device manufactured by using the pattern shown in FIG. 11 according to the second embodiment of the present invention;

FIGS. 13A and 13B are views illustrating a method for separating a pattern according to the second embodiment of the present invention;

DETAILED DESCRIPTION OF THE INVENTION

Hereinafter, embodiments of the present invention will be described with reference to the accompanying drawings.

FIRST EMBODIMENT

An example of a method for correcting pattern data according to a first embodiment of the present invention will be described with reference to a flow chart shown in FIG. 1. In the present embodiment, a metal interconnect formed in a lower layer and a metal interconnect formed in an upper layer are connected to each other by means of a contact formed in a connecting layer (contact hole layer).

Figure 2:
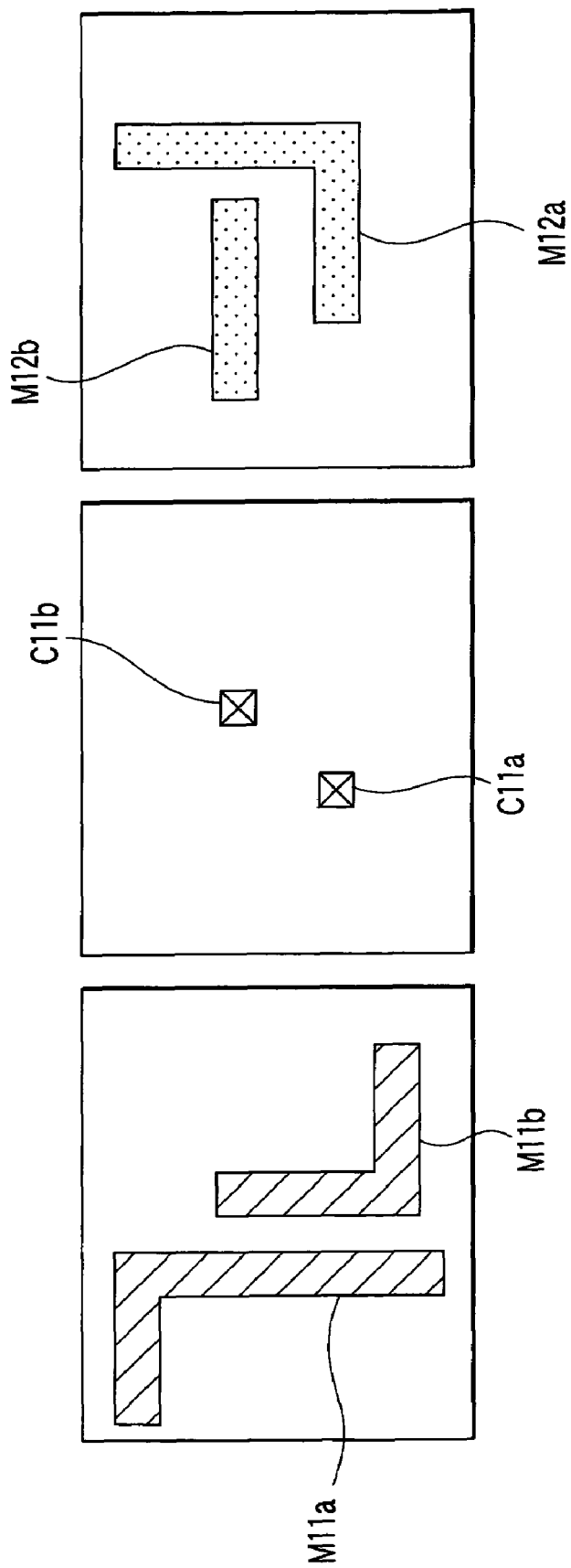
FIGS. 2A, 2B, and 2C are views each showing a pattern of each layer according to the first embodiment of the present invention.
Figure 3:
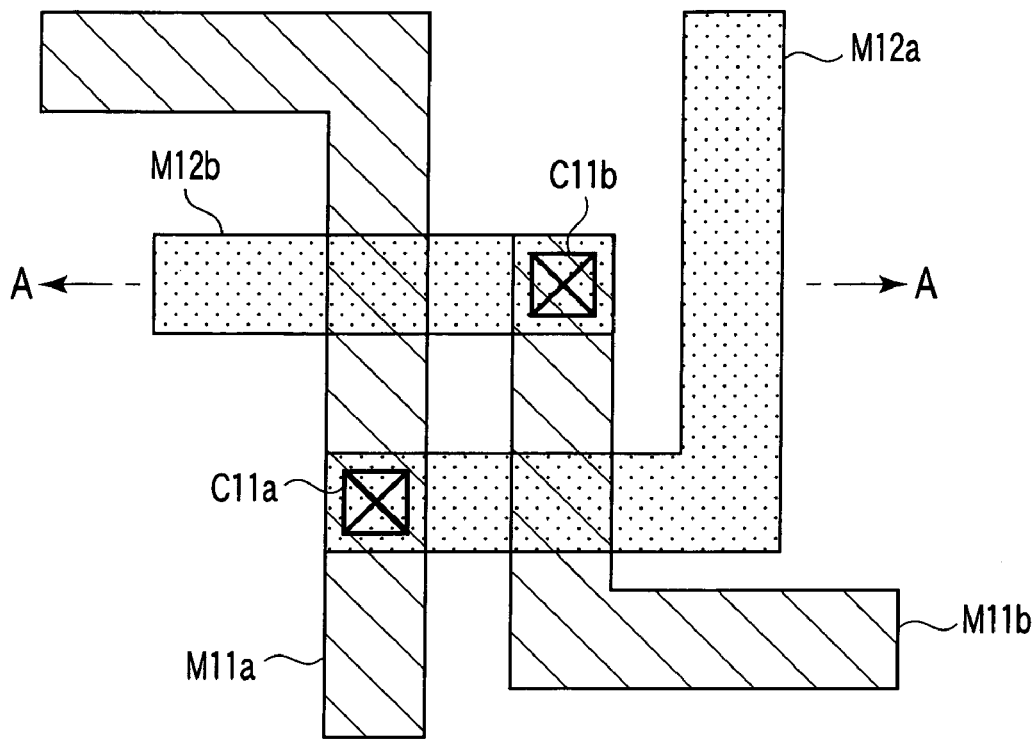
FIG. 3 is a view showing a state in which a pattern of each layer has been overlapped on another pattern according to the first embodiment of the present invention.

FIG. 2A shows metal interconnect patterns M11a and M11b in the lower layer. FIG. 2B shows contact hole patterns (connecting patterns) C11a and C11b in the connecting layer. FIG. 2C shows metal interconnect patterns M12a and M12b in the upper layer. FIG. 3 shows a state in which the patterns of FIGS. 2A, 2B and 2C have been overlapped on each other.

Figure 4:
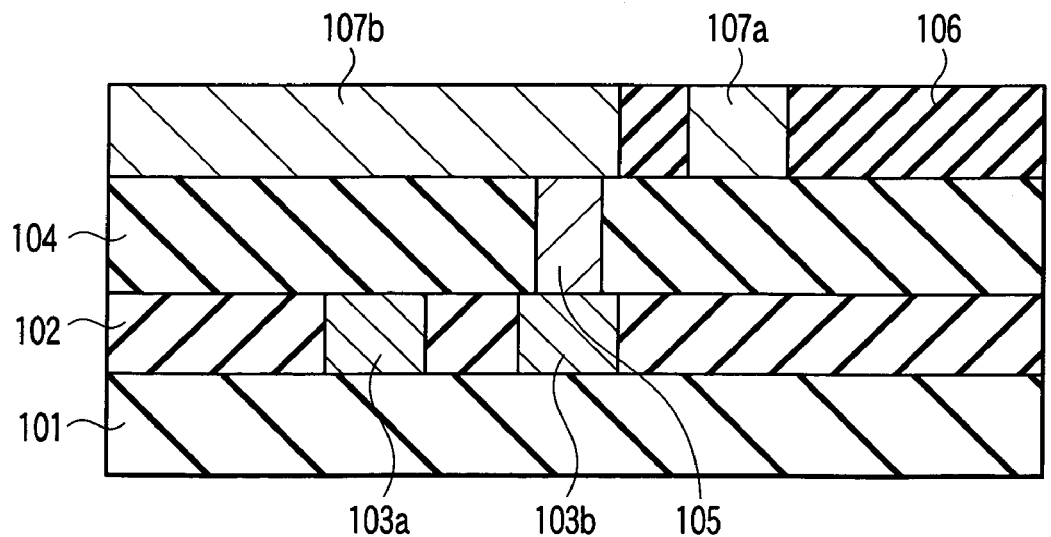
FIG. 4 is a view showing a sectional structure of a semiconductor device manufactured by using the patterns shown in FIGS. 2A, 2B and 2C according to the first embodiment of the present invention.

FIG. 4 shows a sectional structure of a semiconductor device manufactured by using the patterns of FIGS. 2A, 2B and 2C. The cross section shown in FIG. 4 corresponds to a cross section taken along the line A-A of FIG. 3.

As shown in FIG. 4, an interlayer insulating film 102, a metal interconnect 103a (corresponding to a metal interconnect pattern M11a), and a metal interconnect 103b (corresponding to a metal interconnect pattern M11b) are formed on an underlying region 101. An interlayer insulating film 104 is formed on the interlayer insulating film 102. A contact 105 is formed in a contact hole (corresponding to a contact hole pattern C11b) formed in this interlayer insulating film 104. An interlayer insulating film 106, a metal interconnect 107a (corresponding to a metal interconnect pattern M12a), and a metal interconnect 107b (corresponding to a metal interconnect pattern M12b) are formed on the interlayer insulating film 104. The metal interconnect 103b and the metal interconnect 107b are connected to each other by means of the contact 105.

Hereinafter, a method for correcting pattern data according to the present embodiment will be described with reference to a flow chart shown in FIG. 1.

First, pattern data for a connecting layer targeted for correction and pattern data for the lower layer and the upper layer are sampled from design pattern data. That is, pattern data for wiring patterns and contact hole patterns shown in FIGS. 2A, 2B and 2C are sampled (S11).

Figure 5:
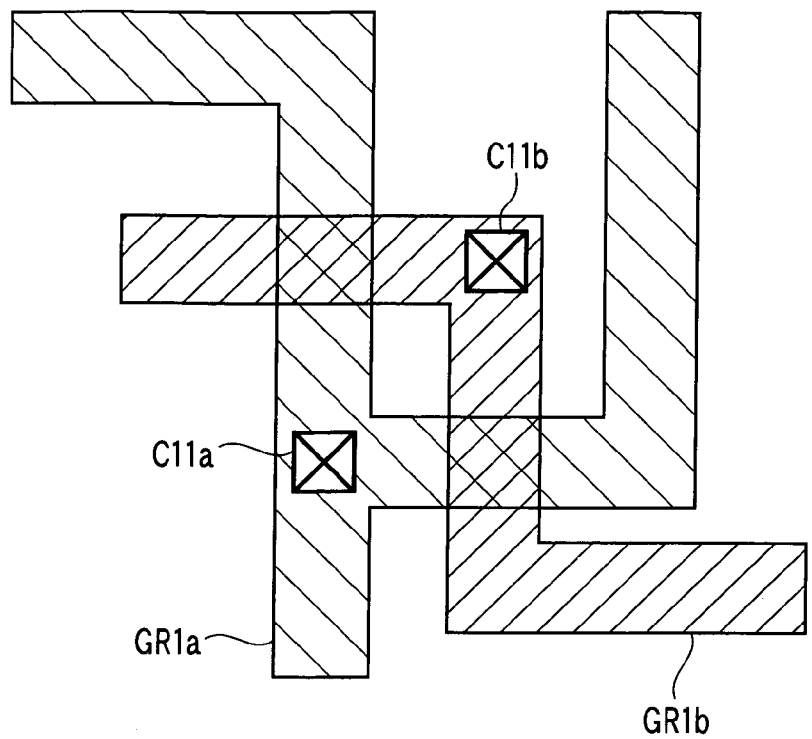
FIG. 5 is a view showing grouped patterns according to the first embodiment of the present invention.

Next, information relating to an electrical connection relationship between the sampled patterns is acquired (S12). Then, grouping is carried out based on the acquired connection information. That is, the patterns included in the lower layer, upper layer, and connection layer are grouped into a plurality of groups in which patterns in the same group are set at the same electric potential when a semiconductor device is actually manufactured (S13). In the present embodiment, as is seen from FIG. 2A, FIG. 2B, FIG. 2C, and FIG. 3, the interconnect pattern M11a included in the lower layer and the interconnect pattern M12a included in the upper layer are connected to each other via a contact hole pattern C11a included in the connecting layer. These patterns are maintained at the same electric potential when a semiconductor device is actually manufactured. The interconnect pattern M11b included in the lower layer and the interconnect pattern M12b included in the upper layer are connected to each other via a contact hole pattern C11b included in the connecting layer. These patterns are maintained at the same electric potential when a semiconductor device is actually manufactured. Therefore, as shown in FIG. 5, one group GR1a is composed of the interconnect pattern M11a, the interconnect pattern M12a and the contact hole pattern C11a, and another group GR1b is composed of the interconnect pattern M11b, the interconnect pattern M12b and the contact hole pattern C11b.

Next, a distance between an edge of a contact hole pattern which belongs to one group and an edge of a pattern which belongs to another group is calculated (S14). Specifically, a distance to the most proximal edge of the pattern which belongs to another group is calculated for each edge of each contact hole pattern. In the illustrative example, a distance between an edge of the contact hole pattern C11a which belongs to the group GR1a and an edge of a pattern which belongs to the group GR1b is calculated, and a distance between an edge of the contact hole pattern C11b which belongs to the group GR1b and an edge of a pattern which belongs to the group GR1a is calculated.

Next, in accordance with the calculated distance between the edges, an edge of the contact hole pattern is moved in a direction in which the size of the contact hole pattern increases (S15). Specifically, a table specifying a correlation between the inter-edge distance and an edge movement quantity is prepared in advance, and the edge movement quantity is determined with reference to the correlation table. For example, in FIG. 5, the left and right edges of the contact hole pattern C11b which belongs to the group GR1b are short in distance relevant to an edge of a pattern which belongs to another group GR1a. Thus, the edge movement quantity is reduced or edge movement is disabled. The lower edge of the contact hole pattern C11b is long to a certain extent in distance relevant to an edge of a pattern which belongs to another group GR1a. Thus, the edge movement quantity is increased to a certain extent. With respect to the upper edge of the contact hole pattern C11b, an edge of a pattern which belongs to another group GR1a does not exist in the vicinity of the edge of the contact hole pattern C11b. Thus, the edge movement quantity is increased. With respect to the contact hole pattern C11a as well, the edge movement quantity is determined similarly.

As described above, as shown in FIG. 6, the contact hole pattern C11a is expanded to C11a', the contact hole pattern C11b is expanded to C11b', and then, corrected pattern data is generated (S16).

Figure 6:
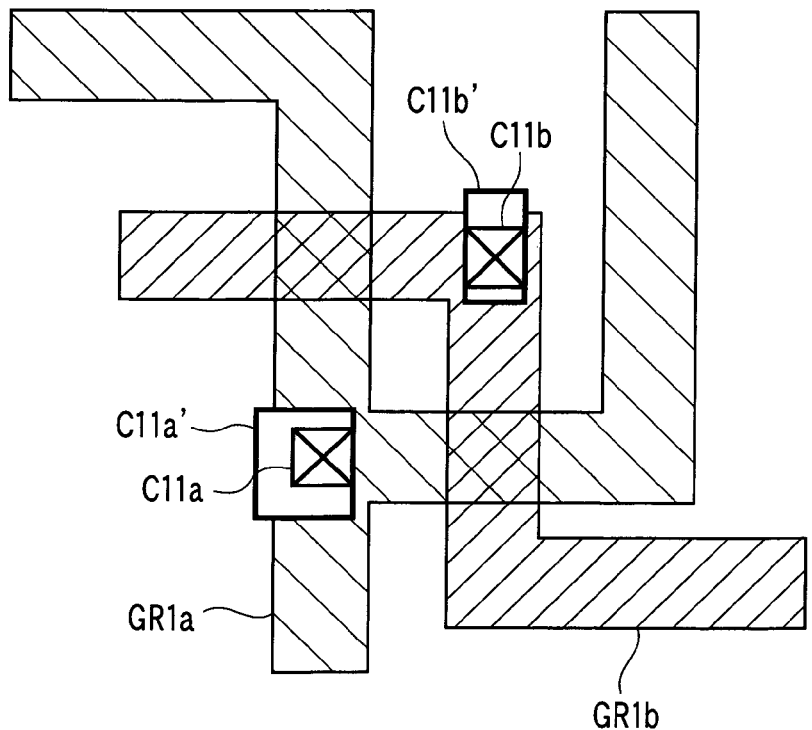
FIG. 6 is a view showing a state in which a size of a contact hole is increased according to the first embodiment of the present invention.

In the example of FIG. 6, for example, the contact hole pattern C11b is converted to the contact hole pattern C11b', as described below. With the left and right edges of the contact hole pattern C11b which belongs to the group GR1b, a distance to an edge of a pattern which belongs to another group GR1a is shorter than a predetermined distance (defined as D1). Thus, these edges are not moved. With respect to the upper and lower edges of the contact hole pattern C11b, a distance to an edge of a pattern which belongs to another group GR1a is longer than the predetermined distance (D1). Thus, these edges are moved. In particular, with respect to the upper edge of the contact hole pattern C11b, an edge of a pattern which belongs to another group GR1a does not exist at least in the vicinity of the edge of the contact hole pattern. Thus, in the case where a distance between edges is very long, the edge movement quantity is increased. Therefore, the upper edge of the contact hole pattern C11b' is positioned outwardly of an overlap region between the interconnect pattern M11b included in the lower layer and the interconnect pattern M12b included in the upper layer (refer to FIG. 3).

As has been described above, according to the present embodiment, an edge of a contact hole pattern which belongs to one group is moved in accordance with a distance to an edge of a pattern which belongs to another group. Thus, the size of a contact hole pattern can be efficiently increased. That is, in the case where a distance between edges is long, there is no danger that, even if an edge movement quantity is increased, the edges come into contact with each other. On the other hand, in the case where the distance between edges is short, the edge movement quantity is reduced or edge movement is disabled, thereby making it possible to avoid contact between the edges. Thus, according to the present invention, a contact hole can be reliably formed, and a contact between the contact hole pattern and the adjacent pattern can be avoided, making it possible to improve the yield of a semiconductor device.

Now, a first modified example of the present embodiment will be described here.

While the above embodiment has described that a correcting process is carried out by using a pattern itself produced by a designer or an automatic interconnect wiring tool (hereinafter, referred to as a source design pattern), the present modified example describes that a biasing process is applied to the source design pattern and a correcting process is carried out by using an interconnect pattern to which the biasing process has been applied.

Figure 7:
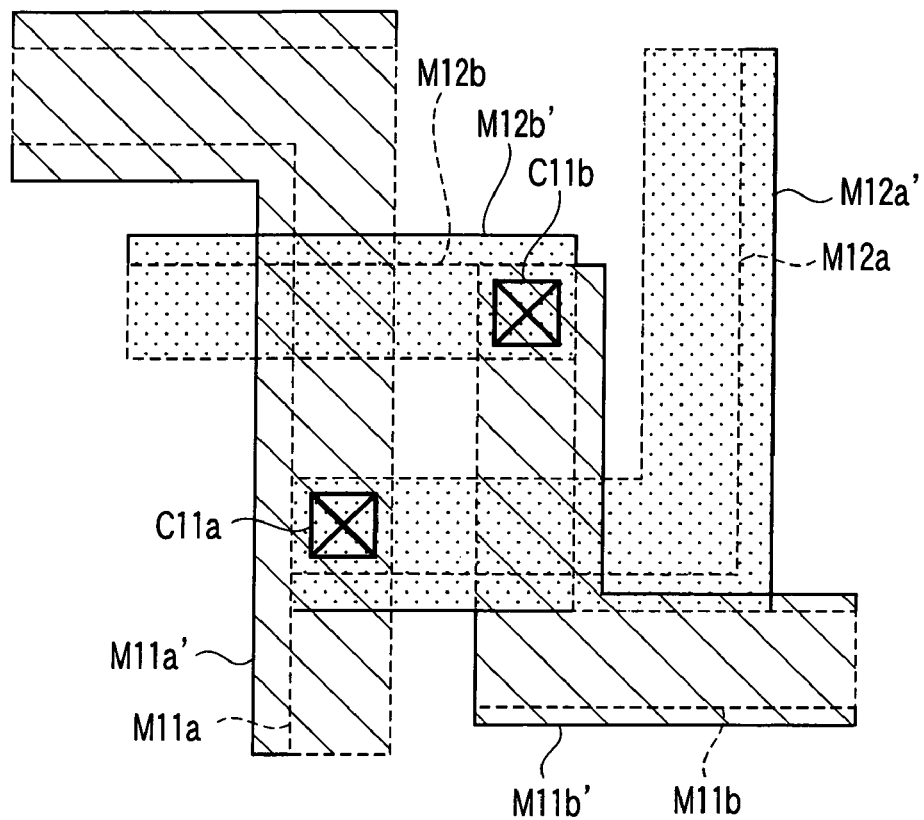
FIG. 7 is a view illustrating a first modified example of the first embodiment of the present invention.

In the biasing process, in accordance with a distance to an edge of another interconnect pattern included in the same layer, an edge of one interconnect pattern is moved in a direction in which an interconnect wiring width of the one interconnect pattern increases. That is, in the case where a distance between edges is long, the interconnect wiring width is enlarged by increasing the edge movement quantity. In the case where the distance between edges is short, the edge movement quantity is reduced or edge movement is disabled, thereby avoiding a contact between the interconnect wirings. By applying such a biasing process, as shown in FIG. 7, the interconnect patterns M11a, M11b, M12a, and M12b are converted to interconnect patterns M11a', M11b', M12a', and M12b', respectively.

Figure 1:
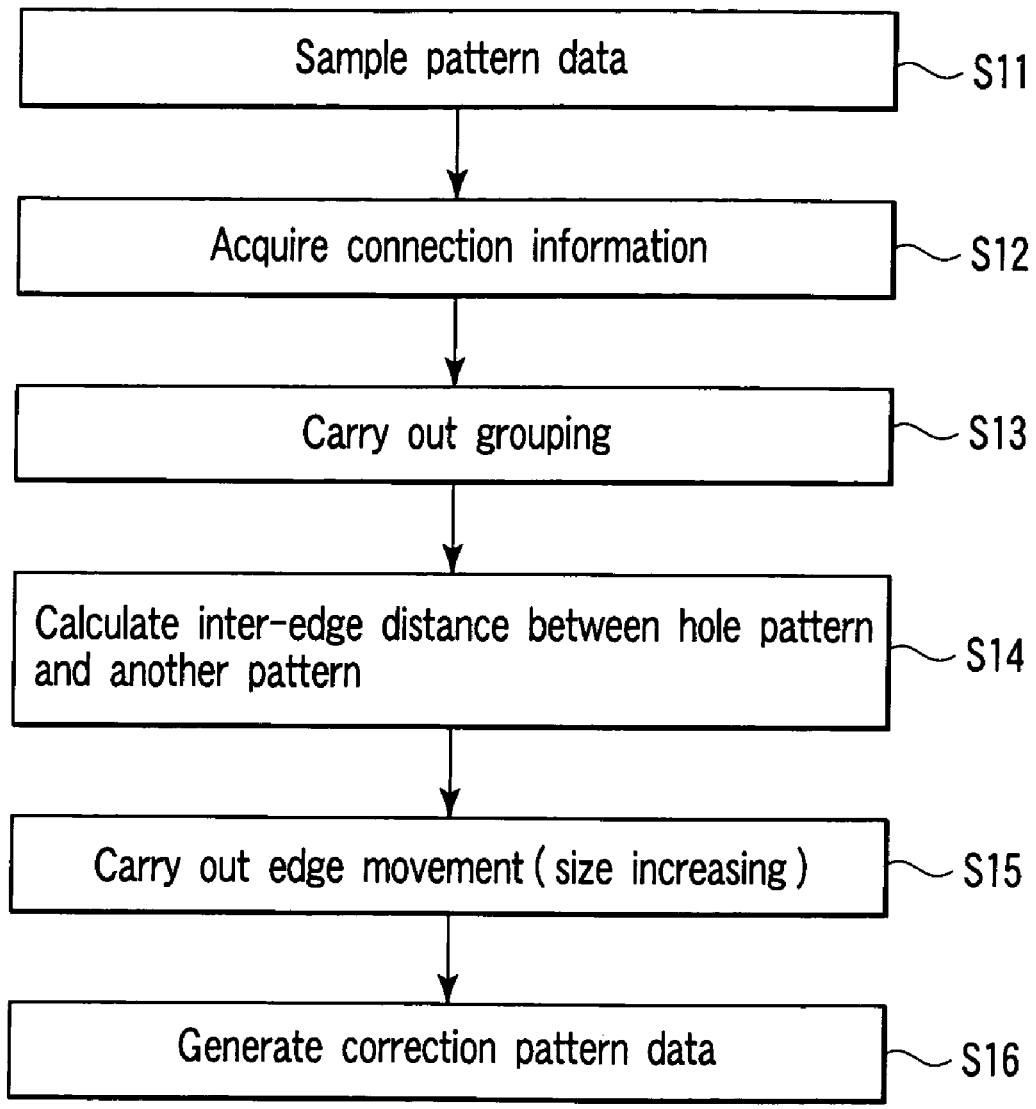
FIG. 1 is a flow chart showing an example of a method for correcting pattern data according to a first embodiment of the present invention.

A process similar to those in steps S11 to S16 of FIG. 1 may be carried out by using the interconnect patterns M11a', M11b', M12a', and M12b' to which the biasing process has been thus applied. Thus, even in the case where the biasing process has been applied to the interconnect patterns, it is possible to attain a function and an advantageous effect similar to those of the above described embodiment.

Now, a second modified example of the present embodiment will be described here.

When an edge of a contact hole pattern is moved in step S15 according to the above described embodiment, there occurs a state such that a distance between the adjacent contact hole patterns belonging to the same group is very short or such that the adjacent contact hole patterns overlap on each other. Patterns which belong to the same group are maintained at the same electric potential when a semiconductor device is actually manufactured. Thus, even if the above described state occurs, no electrical program occurs in particular. However, if a distance between the adjacent contact hole patterns is equal to or shorter than a certain distance, there is a danger that a contact hole pattern cannot be constantly formed. In such a case, there occurs a problem that an inspection noise occurs in a defect inspection.

Figure 8:
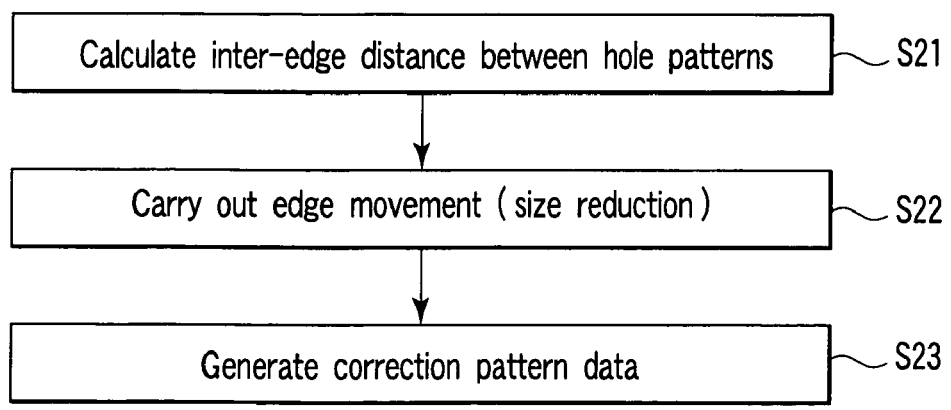
FIG. 8 is a flow chart showing a method for correcting pattern data according to a second modified example of the first embodiment of the present invention.

In the present modified example, the size of a contact hole pattern is increased in step S15 of FIG. 1, and then, a processing operation shown in the flow chart of FIG. 8 is carried out.

Figures 9A, 9B, 9C:
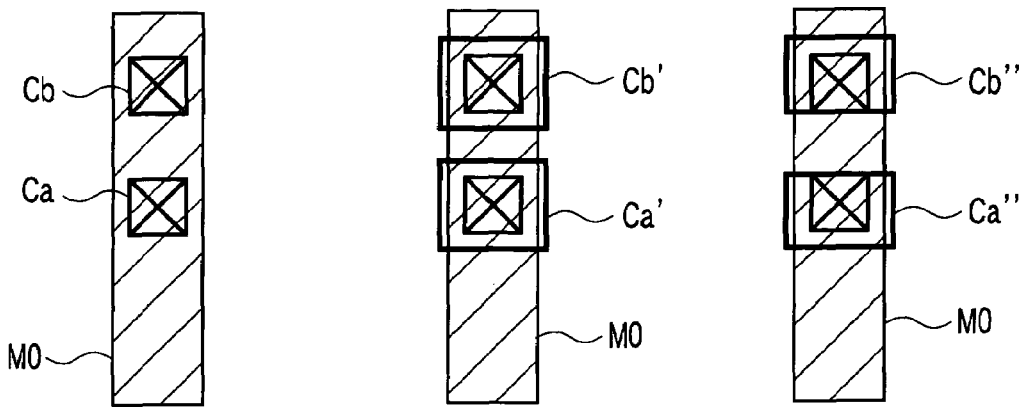
FIGS. 9A, 9B, and 9C are views illustrating the second modified example of the first embodiment of the present invention.

FIGS. 9A, 9B, and 9C are views showing a principle of the present modified example. As shown in FIG. 9A, assume that contact hole patterns Ca and Cb connected to the same metal interconnect pattern M0 are allocated in proximity with each other. With respect to such a pattern, the contact hole patterns are expanded in step S15 of FIG. 1, whereby the expanded contact hole patterns Ca' and Cb' are obtained as shown in FIG. 9B. In the present modified example, after the step S15 of FIG. 1, a distance between opposed edges of the expanded contact hole patterns Ca' and Cb' is calculated (S21). As a result, in the case where the distance between edges is shorter than a predetermined value, an edge of the contact hole pattern is moved in a direction in which the distance between edges increases, in other words, in a direction in which the size of the contact hole pattern is reduced (S22). Specifically, a table specifying a correlation between an inter-edge distance and an edge movement quantity is prepared in advance, and the edge movement quantity is determined with reference to the correlation table. As a result, as shown in FIG. 9C, reduced contact hole patterns Ca" and Cb" are obtained, and corrected pattern data is generated (S23).

Edge movement may be carried out for both of the contact hole patterns or may be carried out for one of the contact hole patterns. In the case where the edges of both of the contact hole patterns are moved, the edge movement quantities may be equal to each other or may be different from each other. For example, in the case where a large contact hole pattern and a small contact hole pattern are proximal to each other, the edge movement quantity of the large contact hole pattern is increased, and the edge movement quantity of the small contact hole pattern is reduced. This is because the smaller contact hole is more likely to have an effect of dispersion in a semiconductor device manufacturing process.

Thus, in the present modified example, a function and an advantageous effect similar to those of the above described embodiment can be attained, and it is possible to avoid a problem which can occur in the case where a distance between edges in the adjacent contact hole patterns is too short.

SECOND EMBODIMENT

Figure 10:
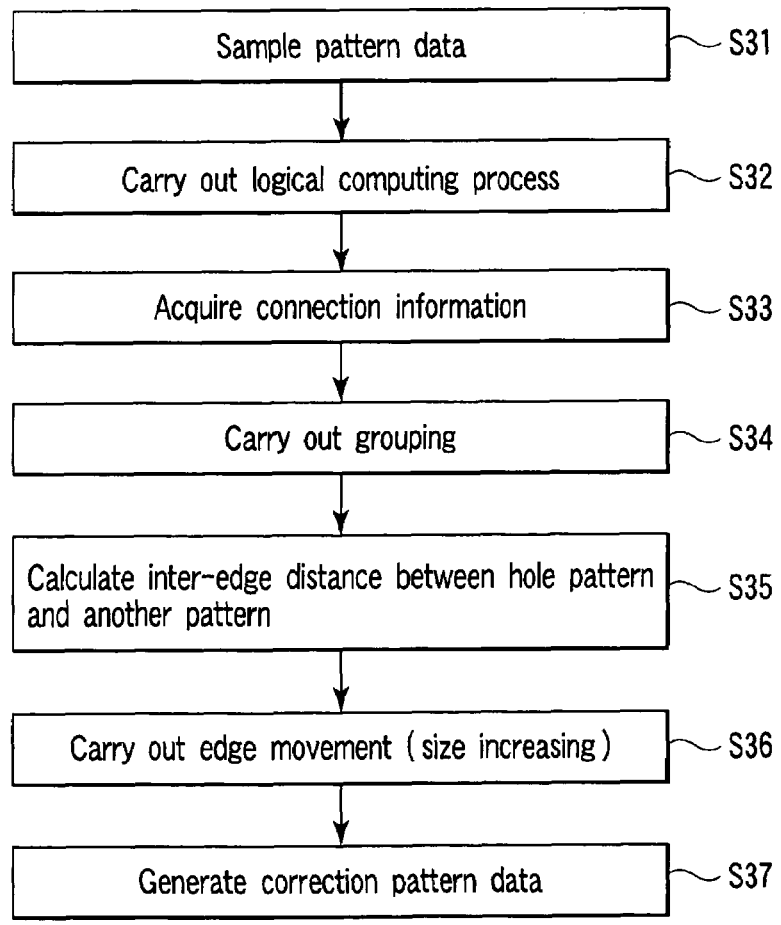
FIG. 10 is a flow chart showing an example of a method for correcting pattern data according to a second embodiment of the present invention.

Hereinafter, an example of a method for correcting pattern data according to a second embodiment of the present invention will be described with reference to a flow chart shown in FIG. 10. In the present embodiment, an element region layer and a gate layer are provided as a lower layer and an interconnect layer is provided as an upper layer. These layers are interconnected to each other by means of a contact formed in a connecting layer (contact hole layer).

Figure 11:
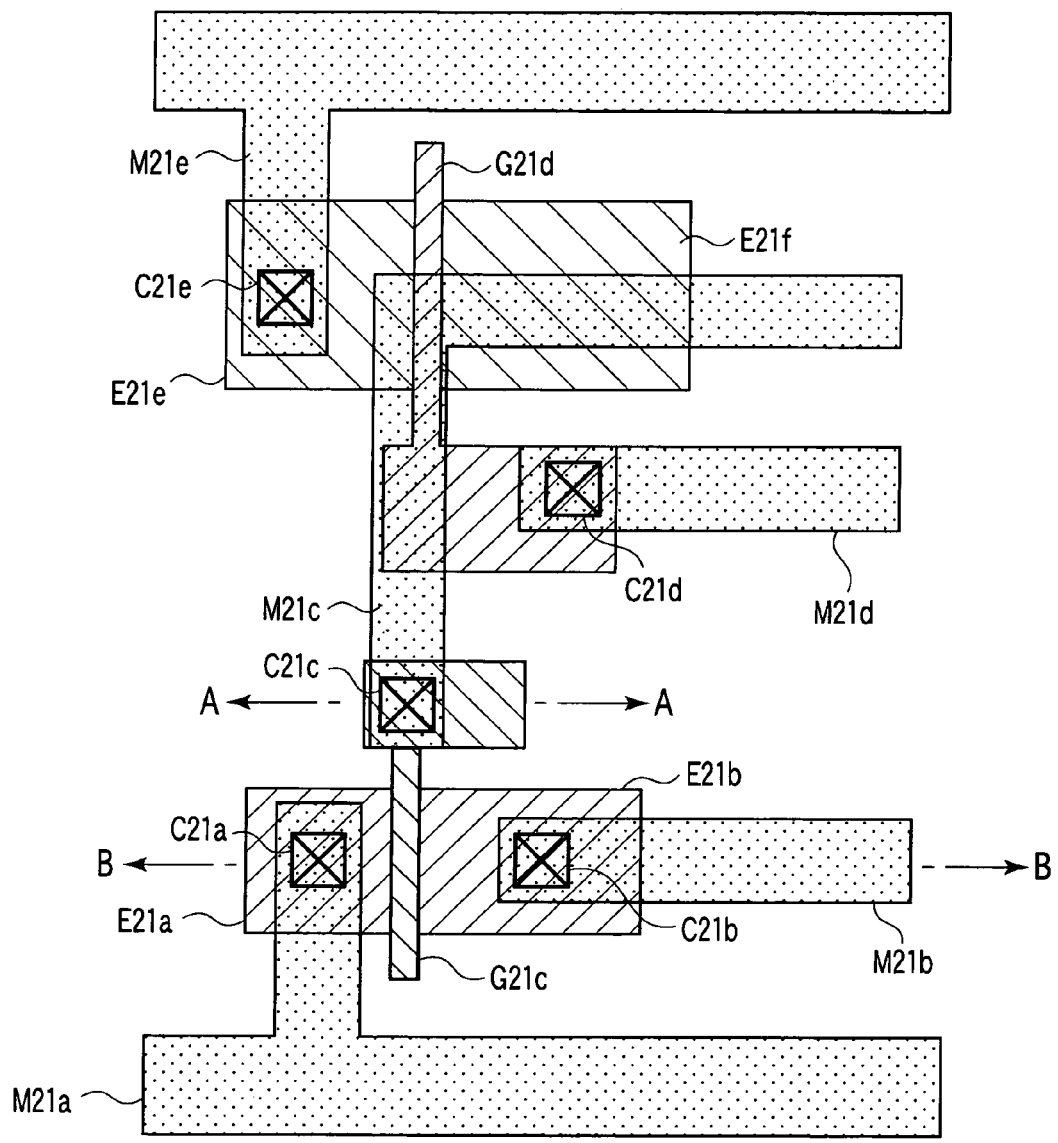
FIG. 11 is a view showing a state in which a pattern of each layer has been overlapped on another pattern according to the second embodiment of the present invention.

FIG. 11 is an overlapped view showing element region patterns (E21a, E21b, E21e, and E21f) in the element region layer; gate patterns (G21c and G21d) in the gate layer; metal interconnect patterns (M21a, M21b, M21c, M21d, and M21e) in the interconnect layer; and contact hole patterns (connecting patterns; C21a, C21b, C21c, C21d, and C21e) in the connecting layer.

FIGS. 12A and 12B each show a sectional structure of a semiconductor device manufactured by using the patterns of FIG. 11. A cross section shown in FIG. 12A corresponds to a cross section taken along the line A-A of FIG. 11, and a cross section shown in FIG. 12B corresponds to a cross section taken along the line B-B of FIG. 11.

As shown in FIGS. 12A and 12B, an element region 202 (corresponding to element region patterns E21a and E21b of FIG. 11) is surrounded by an isolation region 201. A gate interconnect 203 (corresponding to gate pattern G21c of FIG. 11) configuring a gate electrode of a MOS transistor is formed on the isolation region 201 and the element region 202. In addition, an interlayer insulating film 204 is formed on the isolation region 201 and the element region 202. Contacts 205a, 205b, and 205c are formed in contact holes (corresponding to contact hole patterns C21a, C21b, and C21c of FIG. 11) formed in this interlayer insulating film 204. Metal interconnects 206a, 206b, and 206c (corresponding to metal interconnect patterns M21a, M21b, and M21c) are formed on the interlayer insulating film 204.

As is seen from FIGS. 11, 12A, and 12B, the contacts 205a and 205b are used for connection between the metal interconnect 206a and the element region 202 and for connection between the metal interconnect 206b and the element region 202, respectively. The contact 205c is used for connection between the metal interconnect 206c and the gate interconnect 203. That is, a connecting layer in which a contact hole pattern is formed is used for connection of the two lower layers (element region layer and gate layer). Thus, when the size of the contact hole pattern is changed (when the edge of the contact hole pattern is moved), there is a need for considering both of the element region layer and the gate layer as the lower layer.

In addition, as is seen from FIGS. 12A and 12B, the element region 202 is formed as one region. Therefore, the element region patterns E21a and E21b shown in FIG. 11 are not isolated from each other, but are formed as one region. However, the element region patterns E21a and E21b are regions where a source and a drain of a MOS transistor are formed, and the electric potentials of these regions are not usually identical to each other. Thus, when a correcting process is carried out, the element region pattern E21a and the element region pattern R21b are treated as individual regions, respectively.

Hereinafter, a method for correcting pattern data according to the present embodiment will be described with reference to a flow chart shown in FIG. 10.

First, pattern data for a connection layer targeted for correction and pattern data for a lower layer and an upper layer are sampled from items of data of a design pattern. That is, items of pattern data for an element region pattern, a gate pattern, a metal interconnect pattern, and a contact hole pattern shown in FIG. 11 are sampled (S31).

Next, a logical computing process is carried out in order to separate regions in which individual electric potentials are to be set in one element region pattern (S32). FIGS. 13A and 13B are views illustrating this logical computing process. First, as shown in FIG. 13A, an element region pattern E21x (to be separated as an element region pattern E21a and an element region pattern E21b) and a gate pattern G21c are sampled. Next, a subtracting process is carried out as a logical computing process, and an overlap portion of the gate pattern G21c is removed from the element region pattern E21x. As a result, as shown in FIG. 13B, the element region pattern E21a and the element region pattern E21b are separated from the element region pattern E21x.

Next, information relating to an electrical connection relationship between the sampled patterns is acquired (S33). Then, based on the obtained connection information, as in the first embodiment, the patterns contained in layers are grouped into a plurality of groups in which the patterns in the same group are identical to each other in electrical potential (S34).

Figure 14:
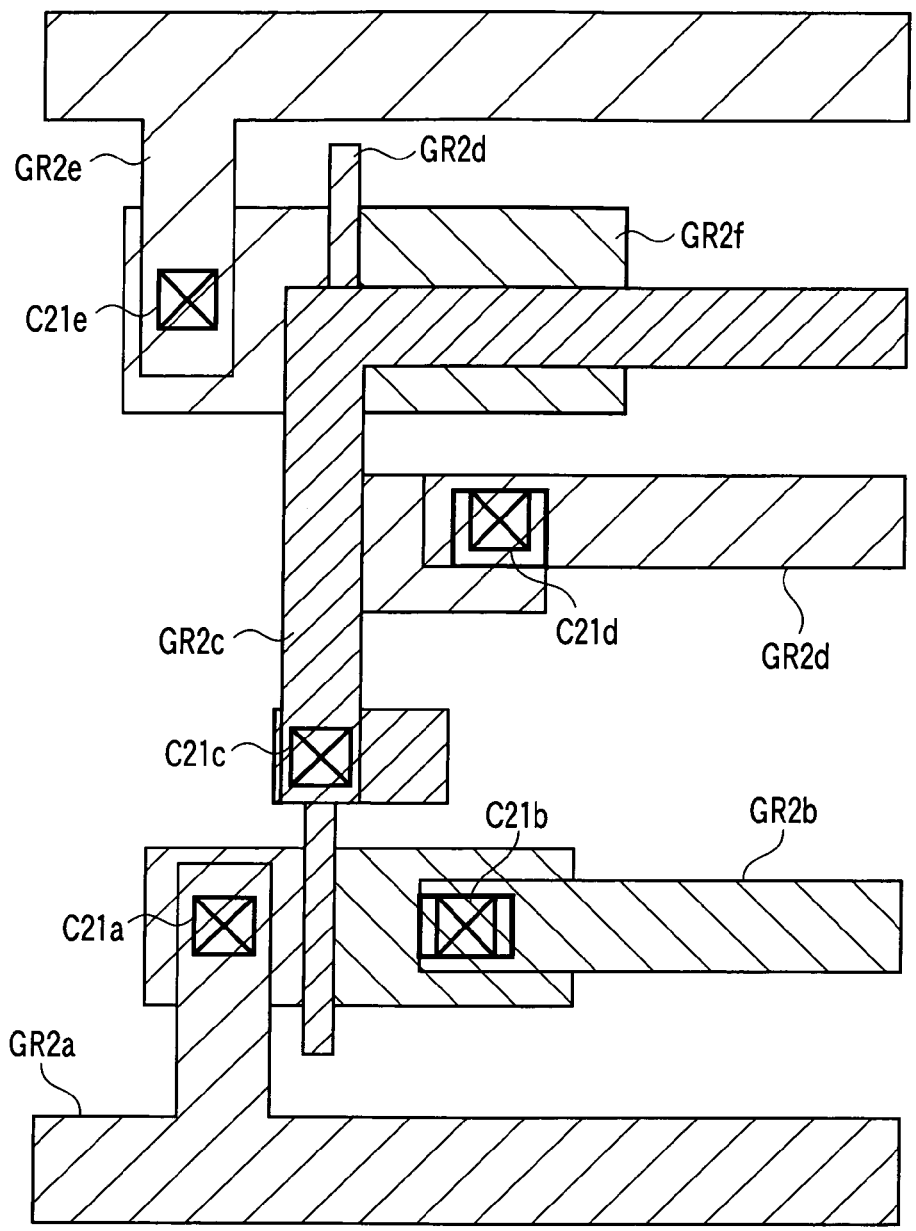
FIG. 14 is a view showing a state in which a size of a contact hole is increased according to the second embodiment of the present invention.

FIG. 14 is a view showing a grouped state. The interconnect pattern M21a and the element region pattern E21a shown in FIG. 11 are connected to each other via the contact hole pattern C21a, and a group GR2a is configured. The interconnect pattern M21b and the element region pattern E21b are connected to each other via the contact hole pattern C21b, and a group GR2b is configured. The interconnect pattern M21c and the gate pattern G21c are connected to each other via the contact hole pattern C21c, and a group GR2c is configured. The interconnect pattern M21d and the gate pattern G21d are connected to each other via the contact hole pattern C21d, and a group GR2d is configured. The interconnect pattern M21e and the element region pattern E21e are connected to each other via the contact hole pattern C21e, and a group GR2e is configured. In addition, a group GR2f is configured by the element region pattern E21f.

Next, as in the first embodiment, a distance between an edge of a contact hole pattern which belongs to one group and an edge of a pattern which belongs to another group is calculated (S35). That is, a distance to the most proximal edge of a pattern belonging to another group is calculated for each edge of each contact hole pattern.

Next, as in the first embodiment, in accordance with the calculated distance between edges, an edge of a contact hole pattern is moved in a direction in which a size of the contact hole pattern increases (S36). Specifically, a table specifying a correlation between an inter-edge distance and an edge movement quantity is prepared in advance, and the edge movement quantity is determined with reference to the correlation table.

Thus, as shown in FIG. 14, each contact hole pattern is expanded as required, and the corrected pattern data is generated (S37).

While the above example has described a case in which a plurality of layers (element region layer and gate layer) exist as a lower layer, in general, even in the case where a plurality of layers exist in at least one of the lower layer and the upper layer, a technique similar to the above described technique can be applied. Thus, even in the case where a plurality of layers exist in at least one of the lower layer and the upper layer, a function and an advantageous effect similar to those of the first embodiment can be attained. In addition, in the case where there exists regions in which individual electric potentials are set in one pattern region, for example, region separation is carried out by the above described proper logical computing process, thereby making it possible to carry out a proper correcting process. In addition, in the present embodiment as well, a technique similar to those described in the first and second modified examples of the first embodiment can be applied. In this case also, a function and an advantageous effect similar to those of the first embodiment can be attained.

Figure 15:
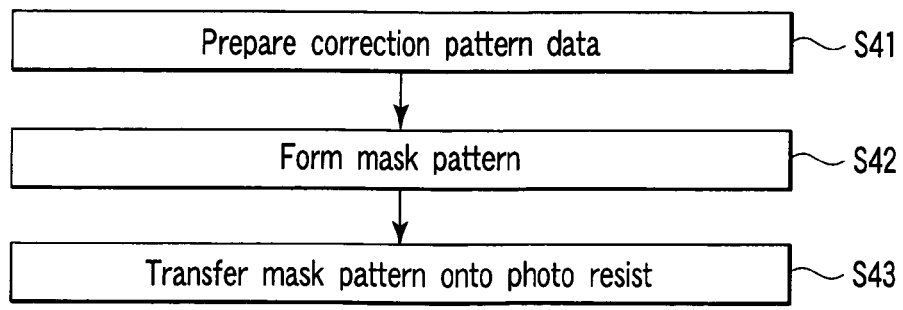
FIG. 15 is a flow chart showing a flow of operation in the case where the pattern data correcting method according to the first and second embodiments of the present invention has been applied to a photo mask manufacturing method and a semiconductor device manufacturing method.

While the first and second embodiments have been described above, the correction pattern data obtained by the correcting method described in the first and second embodiments can be applied to a photo mask manufacturing method and a semiconductor device manufacturing method. That is, as shown in a flow chart of FIG. 15, after correction pattern data has been produced by the correcting method described in the first or second embodiment (S41), a mask pattern is formed from the correction pattern data, whereby a photo mask is manufactured (S42). Further, the mask pattern on the photo mask is transferred (projected) to a photo resist on a semiconductor substrate on which a conducting film or an insulating film and the like has been formed, and an etching process is carried out by using a photo resist pattern obtained by a developing process, thereby making it possible to manufacture a semiconductor device.

In addition, the correcting method described in the first and second embodiments can be carried out by a computer whose operation is controlled by a program having procedures of the method described therein. The above described program can be provided by a recording medium such as a magnetic disk or a communication line (wired network or wireless network) such as the Internet.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A computer-implemented method of correcting pattern data for a semiconductor device, comprising:
   acquiring pattern data for a lower layer, pattern data for an upper layer, and pattern data for a connecting layer containing connecting patterns to connect patterns contained in the lower layer and patterns contained in the upper layer;
   grouping patterns contained in the lower layer, the upper layer, and the connecting layer into a plurality of groups in which patterns in a same group are to be set at a same electric potential;
   acquiring a first distance between one edge of one connecting pattern contained in one group and an edge of a pattern contained in another group; and
   moving the one edge in a direction in which a size of the one connecting pattern increases, based on the first distance.

2. The method according to claim 1, wherein the connecting pattern includes a contact hole pattern.

3. The method according to claim 1, wherein a biasing process is applied to at least one of the pattern contained in the lower layer and the pattern contained in the upper layer.

4. The method according to claim 1, further comprising:
   acquiring a second distance between the one edge of the one connecting pattern and an edge of another connecting pattern contained in the one group; and
   moving the one edge in a direction in which a size of the one connecting pattern decreases, based on the second distance.

5. The method according to claim 1, wherein, in a case where the first distance is greater than a predetermined distance, the one edge is moved in a direction in which the size of the one connecting pattern increases.

6. The method according to claim 1, wherein, in a case where the first distance is smaller than a predetermined distance, the one edge does not move.

7. The method according to claim 1, wherein the lower layer includes an interconnect layer, an element region layer, or a gate layer.

8. The method according to claim 1, wherein the upper layer includes an interconnect layer.

9. A method of manufacturing a photo mask, comprising:
   preparing pattern data corrected by the method according to claim 1; and
   forming a mask pattern from the pattern data.

10. A method of manufacturing a semiconductor device, comprising:
    preparing a photo mask manufactured by the method according to claim 9; and
    transferring a mask pattern of the photo mask to a photo resist.

11. A computer-readable medium storing computer-readable instructions for execution on a computer and used for correcting pattern data for a semiconductor device, the program instructions causing the computer to perform a method, comprising:
    acquiring pattern data for a lower layer, pattern data for an upper layer, and pattern data for a connecting layer containing connecting patterns to connect patterns contained in the lower layer and patterns contained in the upper layer;
    grouping patterns contained in the lower layer, the upper layer, and the connecting layer into a plurality of groups in which patterns in a same group are to be set at a same electric potential;
    acquiring a first distance between one edge of one connecting pattern contained in one group and an edge of a pattern contained in another group; and
    moving the one edge in a direction in which a size of the one connecting pattern increases, based on the first distance.

12. A semiconductor device having a plurality of groups in which patterns in a same group are to be set at a same electric potential, each of the groups comprising:
    a lower layer pattern contained in a lower layer;
    an upper layer pattern contained in an upper layer;
    a connecting pattern contained in a connecting layer between the lower layer and the upper layer, and adopted to connect the lower layer pattern and the upper layer pattern to each other,
    wherein a position of one edge of one connecting pattern contained in one group is determined depending on a first distance between the one edge and an edge of a pattern contained in another group.

13. The semiconductor device according to claim 12, wherein the connecting pattern includes a contact hole pattern.

14. The semiconductor device according to claim 12, wherein the one connecting pattern is provided at a region which corresponds to an overlap region between the lower layer pattern and upper layer pattern contained in the one group,
    and, in a case where the first distance is greater than a predetermined distance, the one edge of the one connecting pattern is positioned outside the overlap region.

15. The semiconductor device according to claim 12, wherein the lower layer includes an interconnect layer, an element region layer, or a gate layer.

16. The semiconductor device according to claim 12, wherein the upper layer includes an interconnect layer.

* * * * *